(12) United States Patent
Thirunavukarasu et al.

(10) Patent No.: US 8,286,123 B1
(45) Date of Patent: Oct. 9, 2012

(54) METHOD AND APPARATUS TO USE PHYSICAL DESIGN INFORMATION TO DETECT IR DROP PRONE TEST PATTERNS

(75) Inventors: Senthil Arasu Thirunavukarasu, Bangalor (IN); Shaleen Bhabu, New Delhi (IN); Vivek Chickermane, Ithaca, NY (US)

(73) Assignee: Cadence Design Systems, Inc., San Jose, CA (US)

(*) Notice: Subject to any disclaimer, the term of this patent is extended or adjusted under 35 U.S.C. 154(b) by 0 days.

(21) Appl. No.: 13/012,079

(22) Filed: Jan. 24, 2011

Related U.S. Application Data

(62) Division of application No. 12/058,134, filed on Mar. 28, 2008, now Pat. No. 7,877,715.

(51) Int. Cl.
*G06F 17/50* (2006.01)

(52) U.S. Cl. ......... 716/136; 714/727; 714/731; 714/738

(58) Field of Classification Search .................. 716/136; 714/727, 731, 738
See application file for complete search history.

(56) References Cited

U.S. PATENT DOCUMENTS

| | | | |
|---|---|---|---|
| 5,887,004 A * | 3/1999 | Walther ...................... | 714/726 |
| 6,028,983 A | 2/2000 | Jaber | |
| 6,625,784 B1 * | 9/2003 | Ohta et al. .................. | 716/136 |
| 6,779,163 B2 | 8/2004 | Bednar et al. | |
| 6,807,656 B1 * | 10/2004 | Cao et al. .................... | 716/115 |
| 6,820,240 B2 | 11/2004 | Bednar et al. | |
| 6,883,152 B2 | 4/2005 | Bednar et al. | |
| 6,986,090 B2 * | 1/2006 | Hathaway et al. ........... | 714/727 |
| 7,107,503 B2 | 9/2006 | Balzer | |
| 7,137,080 B2 * | 11/2006 | Acar et al. ................... | 716/109 |
| 7,277,803 B2 | 10/2007 | Thirunavukarasu et al. | |
| 7,320,115 B2 * | 1/2008 | Kuo .............................. | 716/52 |
| 7,324,914 B2 * | 1/2008 | Jain et al. ..................... | 702/125 |
| 7,331,024 B2 | 2/2008 | Sato et al. | |
| 7,424,696 B2 * | 9/2008 | Vogel et al. .................. | 716/133 |
| 7,571,404 B2 * | 8/2009 | Zhao et al. ................... | 716/106 |
| 7,600,208 B1 * | 10/2009 | Sharma et al. ............... | 716/120 |
| 7,647,540 B2 * | 1/2010 | Rajski et al. ................. | 714/738 |
| 7,669,098 B2 * | 2/2010 | Kapur et al. ................. | 714/726 |
| 7,877,715 B1 | 1/2011 | Thirunavukarasu et al. | |
| 2002/0045995 A1 * | 4/2002 | Shimazaki et al. .......... | 702/77 |
| 2003/0070013 A1 | 4/2003 | Hansson | |
| 2003/0212538 A1 * | 11/2003 | Lin et al. ...................... | 703/14 |
| 2008/0072112 A1 | 3/2008 | Varadarajan et al. | |

OTHER PUBLICATIONS

"U.S. Appl. No. 12/058,134 Notice of Allowance mailed Sep. 15, 2010", 6 pgs.
"U.S. Appl. No. 12/058,134, Non Final Office Action mailed May 25, 2010", 8 pgs.

(Continued)

*Primary Examiner* — Naum Levin
(74) *Attorney, Agent, or Firm* — Schwegman Lundberg & Woessner, P.A.

(57) ABSTRACT

A method is provided to evaluate whether one or more test patterns is power safe for use during manufacturing testing of an integrated circuit that includes a nonuniform power grid and that includes a scan chain, the method comprising: assigning respective toggle count thresholds for respective power grid regions of the non-uniform power grid; and determining whether respective numbers of toggles by scan elements of the scan chain within one or more respective power grid regions meet respective toggle count thresholds for the one or more respective regions during at least one scan-shift cycle in the course of scan-in of a test pattern to the scan chain.

16 Claims, 7 Drawing Sheets

OTHER PUBLICATIONS

"U.S. Appl. No. 12/058,134, Response filed May 7, 2010 to Restriction Requirement mailed Apr. 7, 2010", 10 pgs.

"U.S. Appl. No. 12/058,134, Response filed Aug. 25, 2010 to Non Final Office Action mailed May 25, 2010", 14 pgs.

"U.S. Appl. No. 12/058,134, Restriction Requirement mailed Apr. 7, 2010", 6 pgs.

"U.S. Appl. No. 13/012,070, Supplemental Preliminary Amendment filed Feb. 11, 2011", 10 pgs.

"U.S. Appl. No. 13/012,070, Preliminary Amendment mailed Jan. 24, 2011", 6 pgs.

"U.S. Appl. No. 13/012,087, Preliminary Amendment filed Feb. 23, 2011", 8 pgs.

"U.S. Appl. No. 13/012,087, Preliminary Amendment mailed Jan. 24, 2011", 4 pgs.

Blaauw, D, et al., "Design and Analysis of Power Supply Networks", Chapter 20 of 'EDA for IC Implementation, Circuit Design, and Process Technology' published by CRC Press, Taylor & Francis Group, (2006), 20-1 through 20-14.

Evmorfopoulos, N, et al., "Precise Identification of the Worst-Case Voltage Drop Conditions in Power Grid Verification", International Conference on Computer Aided Design, ICCAD'06; Nov. 5-9, 2006, San Jose, CA, 112-118.

"U.S. Appl. No. 13/012,070, Non Final Office Action mailed Apr. 16, 2012", 17 pgs.

"U.S. Appl. No. 13/012,070, Restriction Requirement mailed Mar. 6, 2012", 6 pgs.

"U.S. Appl. No. 13/012,087, Non Final Office Action mailed Mar. 6, 2012", 10 pgs.

"U.S. Appl. No. 13/012,087, Restriction Requirement mailed Jan. 13, 2012", 6 pgs.

* cited by examiner

FIGS. 2a-c

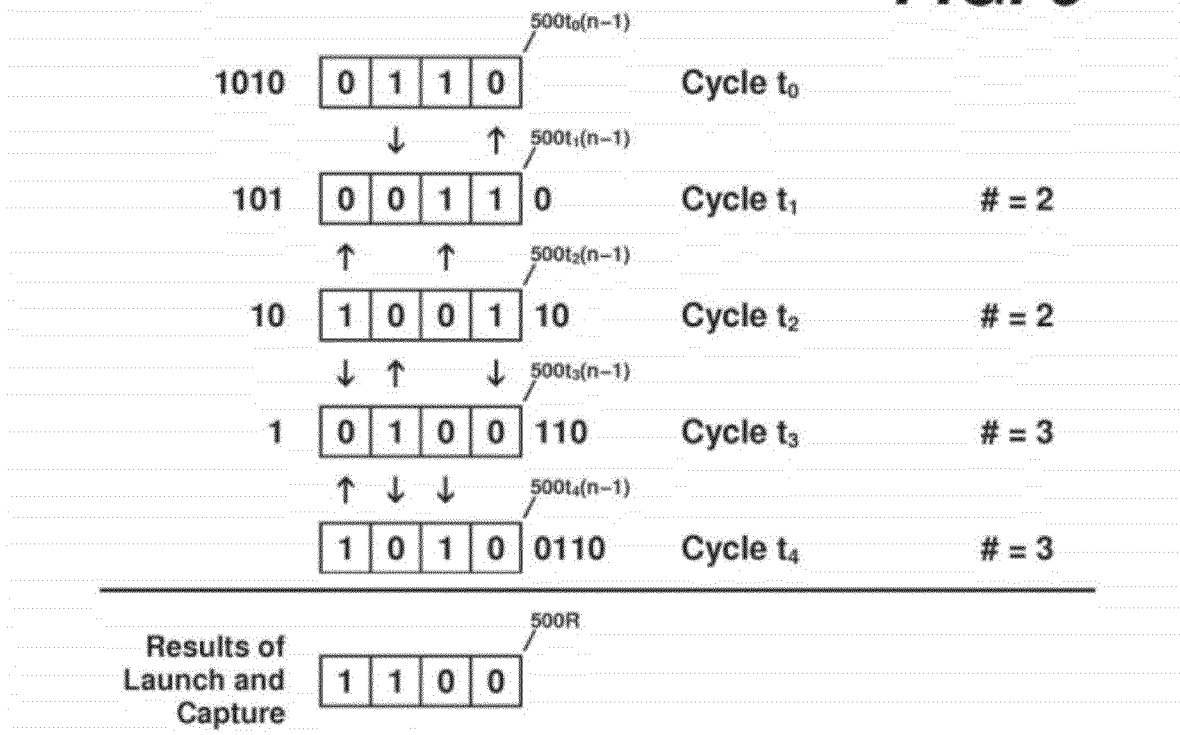
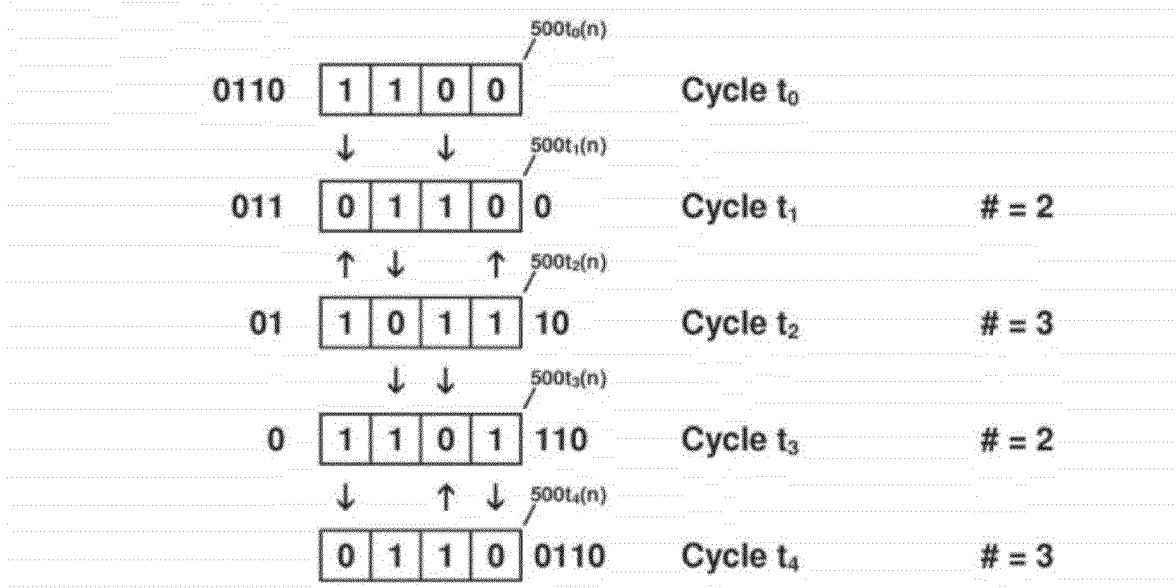
FIG. 6

METHOD AND APPARATUS TO USE PHYSICAL DESIGN INFORMATION TO DETECT IR DROP PRONE TEST PATTERNS

CROSS-REFERENCE TO RELATED APPLICATION

This application is a divisional of Ser. No. 12/058,134 U.S. Pat. No. 7,877,715, entitled "METHOD AND APPARATUS TO USE PHYSICAL DESIGN INFORMATION TO DETECT IR DROP PRONE TEST PATTERNS," filed on Mar. 28, 2008, which is hereby incorporated by reference herein in its entirety.

BACKGROUND OF THE INVENTION

1. Field of the Invention

The invention relates in general to the design of integrated circuits, and more particularly, to testing of integrated circuit designs.

2. Description of the Related Art

As integrated circuits have become more complex and densely packed with gates, they have become progressively more difficult to test in order to ensure desired functionality. As a result, testability has become an increasingly more important and challenging goal of the integrated circuit design process. One approach to testing integrated circuit designs is to take a netlist representing an integrated circuit design and to add and/or replace certain storage elements such as flip-flops with special memory cells, called scan elements. Scan elements allow application of test vectors to certain portions of an integrated circuit produced according to the design.

An automatic test pattern generation (ATPG) process produces test vectors, also referred to as ATPG patterns. A suitable set of test vectors can demonstrate the absence of certain manufacturing faults. ATPG-style reasoning involves loading a test vector to a set of scan cells of an integrated circuit. The circuit performs one or more functional cycles so as to cause the stored test vector values to drive combinational logic to produce new values that are captured by the scan elements. The values stored in the scan elements after the one or more functional cycles are observed and compared with expected values to evaluate whether the circuit has a fault.

FIG. 1 is an illustrative drawing of a portion of an integrated circuit including two scan cells and generic combinational logic and showing shift and capture timing signals. A typical scan element comprises a dual purpose state element that can operate as a functional element in a circuit design during normal circuit operation, and alternatively, can operate as a unit of a serial scan-shift register during scan mode operation. In some embodiments, a scan element is implemented as an edge-triggered flip-flop with a two-way multiplexer (scan mux) to select between a system data D input (during function/capture mode operation) and scan-data SD input (during scan mode operation). The scan mux typically is controlled by a single control called a scan enable (SE) that selects between the scan-data (SD) and the system-data (D). Scan-data is transported from/to test equipment (not shown) by a serial shift operation. To that effect, the scan elements are connected into serial shift register strings called scan chains. It is not unusual for a scan chain to include hundreds or even thousands of individual scan elements, although only two are shown in this simplified illustrative drawing. The scan-in port of each scan cell in the chain is either connected to an external input (scan-in) for the first element in the chain or to the output of a single predecessor element in the chain. The output from the last scan element in the chain is connected to an external output (scan-out).

During scan mode operation, the SE control provides a logic value that causes the scan multiplexers to select the scan-data input (SD). For example, during first scan shift cycles control data (i.e. scan-in data) in the form of an ATPG pattern is serially shifted one bit at a time, from one scan element to the next in the chain. The scan-data follow scan data paths that bypass the combinational logic circuitry interposed between data paths between scan elements. Depending upon the length of the scan chain, hundreds or even thousands of clock cycles may be required to shift-in an entire ATPG pattern to the scan chain.

Once an entire ATPG pattern has been loaded into the scan chain, the scan cells typically operates for two clock cycles in a capture mode. The scan cells' SE control signals are changed to logic values that causes scan multiplexers to select the data input (D). A first clock cycle causes a scanned-in data value in a previous scan element in the chain to be provided to the combinational logic fed by that scan element. A second clock cycle causes a logic value generated by the combinational logic in response to the scanned-in control value to be captured on the D input of the next scan element in the chain.

For example, assume that the generic combinational logic includes an inverter circuit (not shown). Further assume that a value 0 was scanned in to the previous scan element. During the first clock pulse in the capture mode, the logic 0 value is provided to an input of the inverter. The inverter produces a logic value 1 in response to its logic 0 input. During the second scan cycle of the capture mode, the next scan element captures the logic 1 value.

Following the capture cycles, the SE control values are changed to cause the scan elements to select the scan-data (SD) input. During second shift cycles, the captured data values are shifted out of the scan chain for evaluation scn. It will be appreciated that testing ordinarily involves numerous different ATPG patterns used to test for numerous different potential design faults. In order to speed the testing process, a next ATPG pattern may be shifted in to the chain from test equipment, simultaneously with shift-out of previously captured (i.e. observed) data to the test equipment for evaluation. Thus, during the illustrated first scan shift cycles, while a new ATPG pattern is being shifted in to the scan chain, previously captured data may be shifted out for evaluation. Similarly, during second scan shift cycles, as the data captured in response to the first scanned-in data is shifted out, a next ATPG pattern can be shifted in.

Scan shift cycles ordinarily operate at a lower frequency than capture cycles. Scan shift cycles usually operate a frequency that is somewhat lower than the functional mode frequency of operation of the integrated circuit under test. Scan test is a structural test and not functional. Thus, there is no need to test it at-speed. Accordingly, the scan path need not be designed for at-speed operation as in the normal (functional) mode it will never be used. In contrast, capture cycles typically operate at the normal functional mode operating frequency of the circuit under test. For this reason, the capture mode frequency often is referred to as being "at speed".

Power distribution networks distribute power and ground voltages from pad locations to circuit blocks in a design. Shrinking device dimensions, faster switching frequencies and increasing power consumption in deep submicron technologies can cause large switching currents to flow in the power and ground networks, which degrade performance and reliability. Due to the resistance of the interconnects constituting the network, there is a voltage drop across the network, commonly referred to as IR drop. IR drop is a reduction in voltage that occurs on power supply networks (i.e. VDD) in integrated circuits.

Integrated-circuit design usually assumes the availability of an ideal power supply that can instantly deliver any amount of current to maintain the specified voltage throughout the chip. In reality, however, a combination of increasing current per-unit area on the die and narrower metal line widths (which causes an increase in the power-grid resistance) causes localized voltage drops within the power grid, leading to decreased power supply voltage at cells and transistors. These localized drops in the power supply voltage decrease the local operating voltage of the chip, potentially causing timing problems and functional failures.

IR drop can be both a local and global phenomena. IR drop can be local phenomenon when a number of cells in close proximity switch simultaneously, causing IR drop in that localized area. A higher power grid resistance to a specific portion of the chip can also cause localized IR drop. IR drop can be a global phenomenon when activity in one region of a chip causes effects in other regions. For'example, one logic block may suffer from IR drop because of the current drawn by another nearby logic block.

There can be an increased risk of IR drop during ATPG-style testing since the amount of simultaneous switching during a scan shift cycle may exceed the amount of switching expected during functional mode operation for which a chip was designed. The shifting of ATPG patterns or of captured (observed) test results through a scan chain can result in simultaneous switching of more gates than would ordinarily occur during actual functional mode operation of the chip. Moreover, causing the integrated circuit to perform "at speed" functional cycles with a scanned-in test pattern data also may lead to simultaneous switching of more gates than ordinarily would occur during actual functional mode operation of the chip.

One reason for this increased IR drop risk during manufacturing testing is that test patterns often are developed to perform structural testing without regard to the functional operation of the circuit. As such, improvidently selected test patterns may cause excessive switching during manufacturing testing that might never actually occur during functional operation of the chip. Thus, excessive switching during manufacturing testing can lead to IR drop problems or even thermal problems that suggest a design flaw when no flaw actually exists.

Thus, there has been a need to ensure that ATPG patterns do not themselves cause simultaneous switching that results in a significant risk of excessive IR drop and corresponding false detections of manufacturing faults. Aman A. Kokorady and C. P. Ravikumar, in "Static Verification of Test Vectors for IR Drop Failure". ICCAD '03. pp. 760-764, address the problem of validation of a test vector for IR drop safeness using a technique, called "TestRail". Flip-flops are assigned to a power rail, and a toggle activity factor is calculated using a formula that reflects both the toggling activity generated by a test vector and the stress it causes to the power rails. Kokorady et al. disclose the use of standard deviation techniques to find the most active patterns, and then subject them to detailed analysis. Kokorady's, however, teaches the use of VCD, which cannot easily be extended to shift cycles because the VCD are huge and processing for each shift cycle typically is beyond time and space complexities.

Nisar Ahmed et al., in "Transition Delay Fault Test Pattern Generation Considering Supply Voltage Noise in a SoC Design", DAC '07, pp. 533-538, address the detection of IR drop prone test patterns using a technique called Switching Capacitance Average Power (SCAP) model. The technique generates transition delay fault patterns considering the supply voltage noise. The SCAP model is used to account for both capacitances in the design and toggling activity. However. Nisar focused on capture cycles during at-speed test. While an IR drop may occur during shift cycles, the technique disclosed by Nisar is not easily extendable to shift cycles due to the time complexities.

Unfortunately, neither of these prior approaches takes into account physical characteristics of the power supply network such as density of the power grid or decoupling capacitance placement together with switching activity in attempting to evaluate whether ATPG patterns themselves are prone to cause excessive IR drop during scan shift. Therefore, there has been a need for improvements in the evaluation of test patterns for use in manufacturing testing. The present invention meets this need.

SUMMARY OF THE INVENTION

In one aspect, a method is provided to evaluate whether one or more test patterns is power safe for use during manufacturing testing of an integrated circuit that includes a nonuniform power grid. The circuit includes a scan chain in which first scan elements are disposed in a first power grid region and second scan elements are disposed in a second power grid region. A first threshold is obtained that includes a first threshold number of toggles per scan shift cycle for the first scan elements within the first power grid region. A determination is made as to whether a number of toggles by the first scan elements meets the first threshold number of toggles during at least one scan-shift cycle in the course of scan-in of a test pattern within the scan chain. Thus, scan element switching levels in different grid regions are used to determine whether IR drop problems are likely to occur during scan shift.

In another aspect, the first and second grid regions may have different physical characteristics such as grid density or decoupling capacitance density, for example. The first threshold value is determined based at least in part upon the physical characteristics of the first grid region. In yet another aspect, the first and second power grid regions are adjacent to each other, and the first threshold value may be determined based at least in part upon a switching level of the second power grid region.

Thus, in some aspects, physical characteristics of an integrated circuit power grid are used to determine whether shifting of values within a scan chain is likely to cause unacceptable IR drop during manufacturing testing.

BRIEF DESCRIPTION OF THE DRAWINGS

FIG. 6 is an illustrative drawing of representing scan-in to a scan chain of a first test pattern followed by the launch of that first scan pattern and the capture of results in the scan chain, followed by scan-in of a second test pattern to the scan chain and the corresponding scan out of the results from the scan chain in accordance with some embodiments of the invention.

DETAILED DESCRIPTION OF THE PREFERRED EMBODIMENTS

The following description is presented to enable any person skilled in the art to make and use a method and apparatus to evaluate whether integrated circuit switching activity is within a power-safe range, in accordance with embodiments of the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and processes are shown in block diagram form in order not to obscure the description of the invention with unnecessary detail. Thus, the present invention is not intended to be limited to the embodiments shown, but is to be accorded the widest scope consistent with the principles and features disclosed herein.

A robust power distribution network is critical to performance and reliable operation of modern high performance integrated circuits. Excessive voltage drops in the power grid can reduce switching speeds and noise margins of circuits and can inject noise that may lead to functional failures. Moreover, high average current densities in the power distribution network can lead to undesirable wearing due to electromigration. A challenge in the design of power distribution networks is to achieve sufficient voltage regulation throughout the circuit despite wide variations of power demands across the chip, and to build such a grid using minimal area for power grid metal layers.

Figure 2:
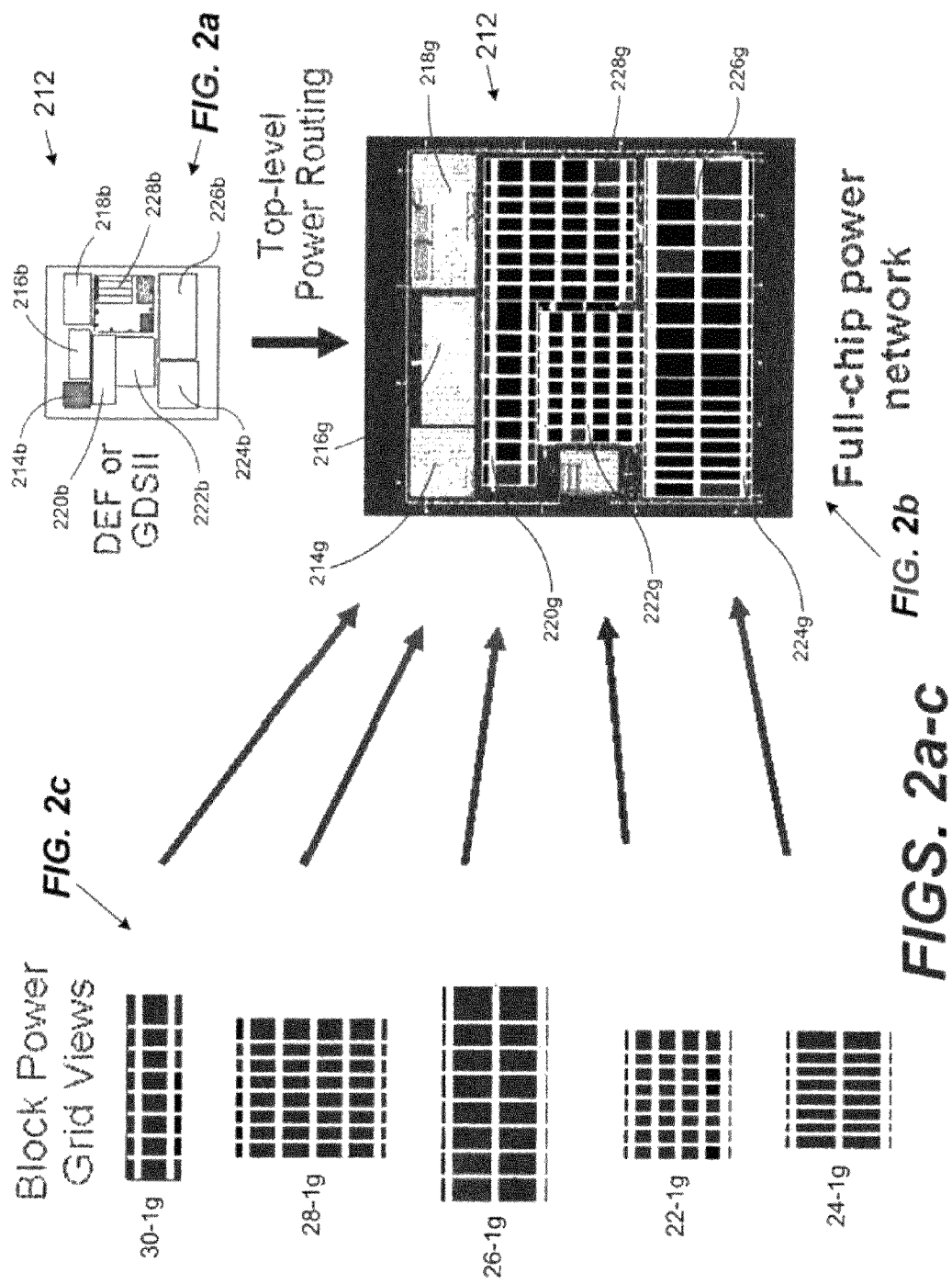
FIG. 2a-2c are illustrative drawings showing a floorplan of an integrated circuit having a plurality of different functional circuit blocks, a full top-level view of power routing for the blocks of the entire circuit, and representative detailed views of portions of different block-level power grids showing comparative grid densities within different blocks.

FIG. 2a-2c are illustrative drawings showing a floorplan of an integrated circuit having a plurality of different functional circuit blocks (FIG. 2a), a top-level view of power routing for the blocks of the entire circuit (FIG. 2b), and representative detailed views of portions of different block-level power grids showing comparative grid densities within different blocks (FIG. 2c). In general, integrated circuits are designed with functional mode operation in mind. Certain functional blocks of a circuit are more prone to IR drop problems than others due to higher simultaneous switching levels, for example. Accordingly, a non-uniform power grid often is provided in high performance circuits in order to ensure delivery of optimum power levels throughout the chip with a power grid that occupies no more area than required in each region. The non-uniformity may involve non-uniformity of one or more physical features of the power grid such as grid density, line thickness and decoupling capacitance placement.

A portion of a non-uniform power grid that supplies a circuit block having a higher level of simultaneous switching during functional mode operation often is designed to be denser than a portion of the power grid that supplies a circuit block having a lower level of simultaneous switching during functional mode operation. Similarly, a power grid may have thicker supply or ground lines in circuit blocks that have higher simultaneous switching levels during functional mode operation. Moreover, a power grid may have a higher density of decoupling capacitances in circuit blocks that have higher simultaneous switching levels during functional mode operation.

FIG. 2a shows that at a circuit block-level, the integrated circuit 212 includes a plurality of functional blocks 214b-228b. Different blocks within the circuit have different switching activity levels. For instance, blocks 214b-218b may comprise a DSP core that has far greater switching activity than that of block 220b, which may comprise an adder circuit, for example. FIG. 2b shows that at a power grid level, the circuit 212 includes a non-uniform power grid that may be optimized for both power regulation and area usage. The power grid view of the circuit 212 includes power grid regions 212g-228g, which have different power grid densities. The difference in grid densities of grid regions 22g and 26g, for example, is indicative of an expected difference in power consumption. Denser power grids typically are designed into regions that are expected to have higher power consumption. FIG. 2c shows a partially exploded view of power grid portions 30-1g, 28-1g 26-1g, 22-1g and 24-1g have different physical grid densities indicative of the different levels of switching activity in the different blocks that they serve during functional operation. Moreover, it will be appreciated that different power grid portions may have different power supply line widths (since thicker lines can handle higher current density) and different decoupling capacitance densities (not shown) in order to compensate for different switching activity levels.

Figure 3:
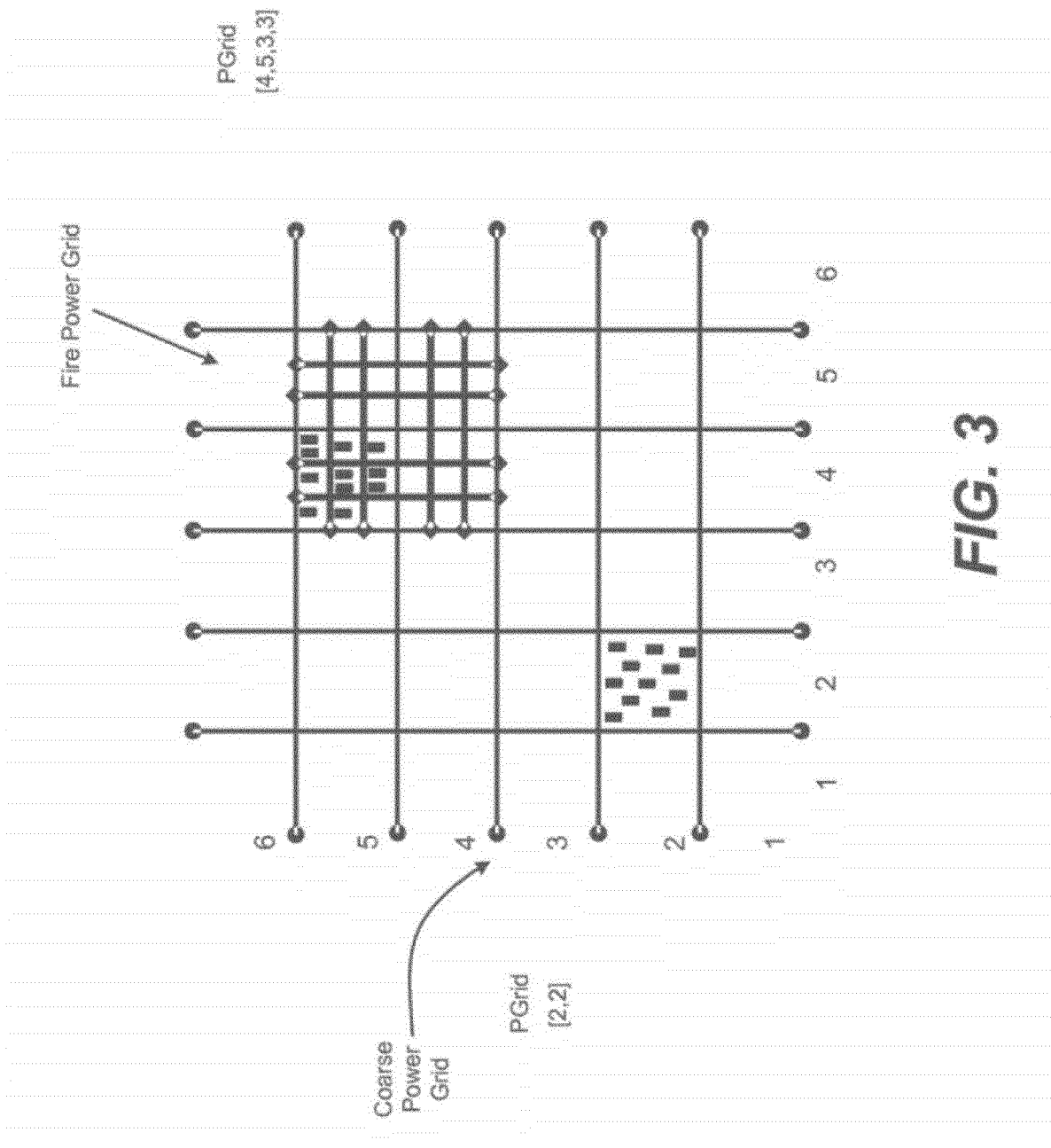
FIG. 3 is an illustrative drawing of a portion of a non-uniform power supply grid showing a sampling of state storage elements powered by different regions of the grid.

FIG. 3 is an illustrative drawing of a portion of a non-uniform power supply grid showing a sampling of state storage elements powered by different regions of the grid. The power supply grid includes first grid portions that include power grid region [2,2] in which power supply lines are spaced apart vertically and horizontally by first amounts and includes a second grid portions that include power grid region [4,5] in which power supply lines are spaced more closely together both vertically and horizontally by second amounts. Local regions of a chip having higher switching activity during functional mode operation often require a locally more robust power distribution network to avoid IR drop problems. In this example, a global power grid having the first vertical and horizontal power line spacings traverses the entire IC. The global power grid alone distributes power to the first grid portions. The second grid portions may include as a denser local grid, within the global grid, that serve a block(s) within the circuit that have higher amounts of simultaneous switching activity during normal function mode operation.

A first collection of state storage elements such as flip-flop circuits are shown placed within the power grid square [2,2].

A second set of state storage elements are shown placed within the global grid at grid square [4,5]. It will be appreciated that additional state storage elements may be present within other grid locations, but these are shown in order to simplify the explanation and to not clutter the drawing. The first set of state elements are fed by the global power grid alone, which has a less dense arrangement of power supply lines. i.e. the lines are spaced farther apart. The second set of state elements are fed by a denser local power grid, which has a denser arrangement of power lines added between global power grid lines. i.e. the lines are spaced closer together.

Consider that in this example non-uniform power grid, a given unit of power grid supplies the entire first set of state elements in the power grid region [2,2]. The first set of state elements comprises ten state elements, and therefore the given unit of power supplies all ten state elements. However, the finer grain second (local) power grid supplies power to fewer state elements per unit of power grid. Specifically, for example, in the more densely spaced power grid region, that same unit of power grid supplies the single state element within the denser grid location [4,5,1,3], and the single state element within the denser grid location [4,5,2,3], and the two state elements within the denser grid location [4,5,3,3], for example. Also, that same unit of power grid supplies the single state element within the denser grid location [4,5,1,2], and the two state elements within the denser grid location [4,5,2,2], and the single state element within the denser grid location [4,5,3,2], for example. Additionally, the same unit of power grid supplies the two state elements within the denser grid location [4,5,2,1] and the single state element within the denser grid location [4,5,3,1], for example.

Hence, the number of state elements fed per unit power grid in power grid region [2,2] is less compared to the number of state elements fed per unit power grid in power grid region [4,5]. The denser local grid spacing within region [4,5] makes the second set of state elements less susceptible to IR drop than the first set of state elements in power grid [2,2]. By way of hypothetical example, based upon power grid physics, it could be that if 50% of the first state elements switch in any clock cycle then the likelihood of a current surge and hence an IR drop would be greater than it 75% of state elements of second set switch in a single clock cycle. This is because the grid region that supplies the first set of state elements is less dense (coarser) than the grid that supplies the second set of state elements.

The inventors have recognized that the physical design of a non-uniform power grid has an impact upon the likelihood that an ATPG pattern will result in an excessive. IR drop during shift scan cycles and also during capture cycles. In accordance with some aspects of the invention, test patterns are analyzed to determine switching activity per state element. Toggle activity for the pattern is determined for different regions of the power grid based upon the switching activity. The toggle activity for the different regions is evaluated relative toggling activity threshold criteria. In some embodiments, if the switching in one or more power grid regions exceeds a selected threshold according to the criteria, then the pattern may be declared as prone to IR drop related failures. For example, a user set switching activity threshold can be chosen based upon factors such as semiconductor process technology and power grid dimensions.

Different regions of the same grid may have different switching activity thresholds. Assume, for example, that the first set of storage elements within location [2,2] and the second set of storage elements within location [4,5] are implemented as scan elements in a scan chain. The second region [4,5] has a denser placement of power grid lines, and therefore, is likely to be more robust and may be able to withstand perhaps up to 60% of the state element of the second set switching during a single clock cycle, for example. However, the first region [2,2] has a wider, less dense, placement of power grid lines and therefore, is less robust and may be able to withstand perhaps up to 30% of the state element of the first set switching during a single clock cycle, for example.

Moreover, placement of decoupling capacitances within different regions of a power grid can influence the robustness of the power distribution network and its susceptibility to IR drop in the face of a high volume of simultaneous switching activity. Decoupling capacitances act as charge reservoirs and feed the power grid with quick charges when there is a power surge. In an integrated circuit designed using standard cells, decoupling capacitances typically are inserted in intermediate locations between storage elements (e.g., flip-flops) and standard cells.

In some embodiments of the invention, a system programmed according to a computer program process determines switching activity associated with a test pattern per scan cycle for one or more segments of a given scan chain. A data structure created in computer readable medium represents the given scan chain in a circuit design or at least a portion thereof. For each scan element in the scan chain and for each scan shift cycle (i.e. for each shift by one hit), the process determines whether the scan element toggles (i.e. changes state). The process correlates toggle counts for scan elements represented in the data structure with power grid locations of corresponding scan elements in the design. In other words, scan elements in the data structure correspond to a scan elements in the design, and scan elements in the design are associated with power grid regions, such as grid squares, for example. Thus, in determining a toggle count per shift cycle for the individual scan elements in the scan chain that correspond to a given power grid region, the process in effect can determine a toggle count per shift cycle for such given power grid region of the design. Different power grid regions may be assigned different switching activity threshold criteria to determine whether toggle activity during any given scan shift cycle involving the test pattern is likely to produce excessive IR drop. If a determination is made that no scan shift cycle results in excessive IR drop within a power grid region, then the test pattern is declared power-safe. If on the other hand, a determination is made that one or more scan shift cycles results in excessive IR drop within any power grid region, then the test pattern is flagged for further analysis; such test pattern may be discarded or may be re-designed to make it power-safe.

Figure 4:
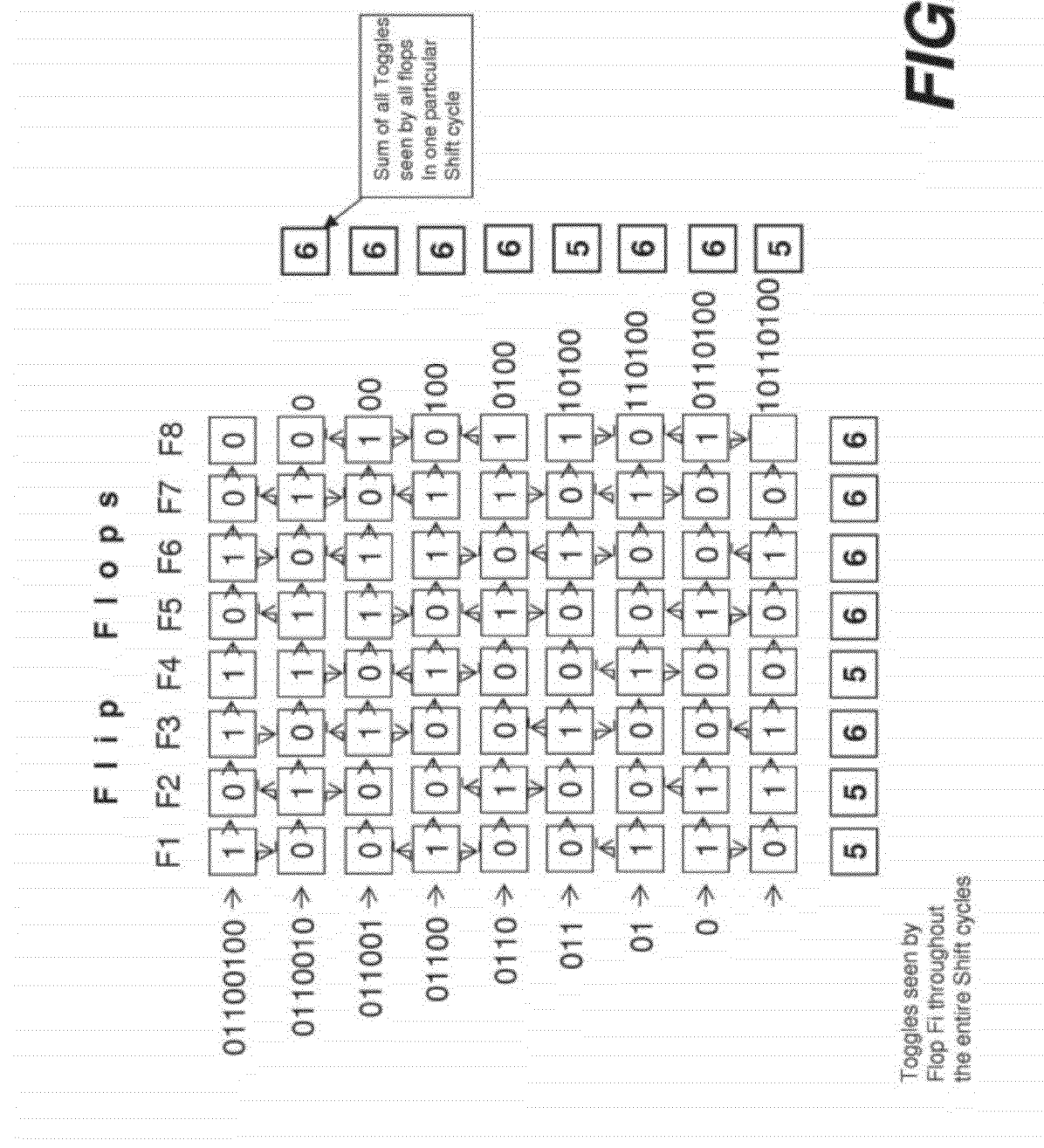
FIG. 4 is an illustrative drawing that shows scan-in of a test pattern to a scan chain and corresponding scan out of prior scan contents from the scan chain and that shows a total number of toggles per individual scan shift cycle and that shows a total number of toggles for each scan element in the course of a entire scan shift cycles in accordance with some embodiments of the invention.

FIG. 4 is an illustrative diagram of a scan chain showing contents of each scan element at each clock cycle of a scan shift process in which scan-in values scanned in to one end of the scan chain and scan-out are scanned out the other side. The sample scan chain comprises only eight scan elements F1-F8, although an actual scan chain may include hundreds or even thousands of scan elements. A data structure representing this scan chain is encoded in computer readable memory as part of a simulation model of an integrated circuit for which test patterns are developed. The illustrative drawing shows the contents of at t00 just before the start of scan shift and during eight consecutive scan clock cycles t1-t8. The example scan process involves a scan-in of a new eight-bit ATPG pattern 01100100. At time t0, just before the start of the scan-in of the new ATPG pattern, the prior contents of the shift register scan elements are 10110100. As explained in detail below, as the new ATPG pattern is scanned in bit-by-bit, clock cycle by clock cycle, the prior contents of the scan chain are shifted out bit-by-bit, clock cycle by clock cycle.

Each different view of the scan-chain shows the contents of the scan elements of the scan chain at a different time cycle increment of the scan process, and to the left shows remaining ATPG patterns bits yet to be scanned in and to the right shows bit values that already have been scanned out. The view labeled cycle t0 of the drawing represents the scan chain and its contents at time t0, just prior to the start of the scan process. At time t0, the scan elements F1 to F8 contain logical values, 10110100, respectively. This constitutes the prior contents of the scan chain. During a first clock cycle t1, represented by cycle t1, the contents of all eight scan elements shift by one element to the right, and a new value 0, the first value of the ATPG pattern, is shifted in to F1. In addition, during the first scan clock cycle t1, a prior value 0 is scanned out of F8, the last scan element in the scan chain. Just after the first clock cycle t1, the contents of the scan chain are 01011010 shown in scan elements F1 to F8 respectively. The remaining portion of the ATPG pattern to be scanned in is 0110010 shown on the left, and the 0 value that has been shifted out is shown on the right. During a second clock cycle t2, represented by the view labeled cycle t2, the contents of all eight scan elements are again shift by one element to the right, and a next new value 0, the second value of the ATPG pattern, is shifted in to F1. In addition, during the second scan clock cycle t2, a a next prior value 0 is scanned out of F8, the last scan element in the scan chain. As shown in the view labeled cycle t2, after the second clock cycle t2, the contents of the scan chain are 00101101 shown in scan elements F1 to F8 respectively, the remaining portion of the ATPG pattern to be scanned in is 011001 shown on the left, and the values 00, shown on the right, have been shifted out over the course of scan cycles t1-t2. The shift-in process continues through eight clock cycles t1-t8 until all eight bits of the ATPG pattern have been shifted in to the scan chain. Referring now to the view labeled cycle t7 there is shown results after clock cycles t1-t7. The contents of the scan chain are 11001001 shown in scan elements F1 to F8 respectively. The remaining portion of the ATPG pattern to be scanned in is 0 shown on the left, and the bit pattern 0110100 has been shifted out shown on the right. The view labeled cycle t8, represents results after clock cycles t1-t8. The entire eight-hit ATPG pattern has been scanned in to the scan chain, and the contents of the scan chain are 11001001 shown in scan elements F1 to F8 respectively. There are no additional ATPG pattern bits shown to the left to be scanned in. The entire original contents of the scan chain have been scanned out, as indicated by the string of values 10110100 shown on the right.

FIG. 4 also shows the switching activity in terms of the total number of toggles per individual scan shift cycle and the shows the total number of toggles for each scan element in the course of the entire scan shift cycles. Referring to views labeled cycle t0 and cycle t1, the contents of six scan elements. F1, F2, F3, F5, F6 and F7 change during the first time cycle t1. Scan elements F2, F5 and F7 change from 0 to 1 (indicated by upward arrows), and the contents of scan elements F1, F3 and F6 change from 1 to 0 (indicated by downward arrows). The number 6 in the box to the right in the view labeled cycle t1 indicates the switching activity in terms of the total number of toggles during the first scan shift cycle. Referring to views labeled cycle t1 and cycle t2, the contents of six scan elements. F2, F3, F4, F6, F7 and F8 change during the second time cycle t2. Scan elements F3, F6 and F8 change from 0 to 1 (indicated by upward arrows), and the contents of scan elements F2, F4 and F7 change from 1 to 0 (indicated by downward arrows). The number 6 in the box to the right in the view labeled cycle t2 indicates the switching activity during the second scan shift cycle. The boxes next to each of the views of cycles t1-t8 represent the total number of toggles per scan shift cycle. For example. Referring to the views labeled cycle t7 and cycle t8, the contents of five scan elements. F1, F3, F5, F6 and F8 change during the eighth time cycle t8. Scan elements F3 and F6 change from 0 to 1 (indicated by upward arrows), and the contents of sc6an elements F1, F5 and F8 change from 1 to 0 (indicated by downward arrows). The number 5 in the box to the right of view labeled cycle 8 indicates the switching activity during the second scan shift cycle.

FIG. 4 shows the number of toggles per scan element in the course of the entire scan process. In particular, at the bottom of FIG. 4, following the nine views of each scan element there is a number indicating the total number of times the scan element toggled in the course of the entire scan process. For example, scan element F1 toggled a total of 5 times as indicated by the number 5 in the box below the F1 column. Specifically, scan element F1 toggled during scan cycles, t1, t3, t4, t6 and t8. Also, for example, scan element F7 toggled 6 times as indicated by the number 5 in the box below the F1 column. Scan element F7 toggled during scan cycles t1, t2, t3, t5, t6 and t7. This overall toggle activity per scan element provides a measure of overall power consumed by individual scan elements throughout the entire scan-in process. This overall power consumption information for individual scan elements, in turn, can be used to estimate overall power consumption, and related thermal effects, throughout an entire shift-in operation due to switching of scan elements spaced close together in the integrated circuit, for example. If the overall power consumption due to shift-in of an ATPG is too high, then the pattern may be discarded or marked for modification or its place or order in a test pattern database may be changed so as to alter the number of toggles involved in shifting it into the scan chain by changing the likely prior contents at the time of its shifting in.

The above process to determine switching activity during scan-shift is accomplished under control of a switching activity measurement process controlled by a computer program encoded in a computer readable medium. As explained above with reference to FIG. 3, different scan elements of the scan chain may be associated with different regions of the power grid, which may have different switching activity thresholds. For instance, the power grid density in region [2,2] is less than that of region [4,5]. Therefore power grid region [2,2] is likely to be assigned a lower switching activity threshold than power grid region [4,5].

In accordance with some embodiments, a designer-selected switching activity level activity threshold is determined in accordance with a process described according to the following pseudo code stored in computer readable medium.

if (density of power grid less than x %)
     then if (decap placement in the grid is less than y %)
       and if (flip-flop switching is greater than z %)
         // then there are potential IR drop concerns.

The values for x, y and z are user-selected parameters based upon factors such as technology considerations and the level of pessimism, i.e., level of risk aversion. In some embodiments, a data structure to receive user-specified switching level tolerance parameters can be stored in computer readable medium in an industry standard format such as the Common Power Format (CPF). The CPF can permit retrieval and setting of (x,y,z) parameter values through text file keywords, for example.

The (x,y,z) values in this example are user set parameters based on the technology process and a (subjective) measure of designer 'pessimissm', i.e., the designer's belief as to the relationship between the parameter values and switching activity level that will result in deleterious IR voltage drop. For example, assume that the flip-flop switching activity for a given grid region is determined to be 65% during a given clock cycle during scan. Further, assume that the given grid region is 2 units by 2 units and that of 5% of 2 units by 2 units have decaps. A determination of whether the 65% switching level exceeds a switching threshold would depend upon user threshold limits set using the (x,y,z) variables. For example, if the user sets threshold limits which prescribe that a 3 unit by 3 unit grid with a decap density of 4% can take up to 75% toggles per clock cycle, then the above 65% switching case is not a problem. However, for example, if the user specified only a 50% toggle rate per clock cycle, then the above 65% switching case would surpass the threshold. The designer would be alerted of the potential problem with the switching pattern, and then could address the problem by modifying the pattern, for instance.

Moreover, the switching activity threshold also may be influenced by switching activity in an adjacent grid region. The inventors have recognized that switching of regions of a grid adjacent to a given region may influence IR drop within that given region. For example, if one power grid region has a switching level during a given scan shift clock cycle that exceeds a threshold for that region, but another adjacent power grid region has a switching level during the same clock cycle that is far below its threshold (e.g. less than 10% of its threshold), then IR drop in the former power grid region can be compensated for automatically by power in the adjacent region. Thus, switching level in an adjacent grid region is another factor that may be included in determination of threshold switching level for a given grid region.

Referring again to FIG. 4, as a first example, assume that the scan elements F1-F8 represent eight scan elements from the first set of scan elements within grid location [2,2]. In that case, the switching activity during each scan cycle would be evaluated against a switching activity threshold set according to the above process for grid location [2,2]. As a second example, assume instead that the scan elements F1-F8 represent eight scan elements from the second set of scan elements within grid location [4,5]. In that case, the switching activity during each scan cycle would be evaluated against a switching activity threshold set according to the above process for grid location [4,5]. It will be appreciated that an actual scan chain may be much longer and may include some segments that include scan elements associated with less dense power grid regions with lower switching activity thresholds and that include other segments that include scan elements associated with denser power grid regions with higher switching activity thresholds. A process in accordance with the present invention, therefore, permits evaluation of whether an ATPG pattern is power-safe based not only upon switching activity, but also upon the physical characteristics of the power grid associated with different scan chain scan elements of the scan chain.

Figure 5:
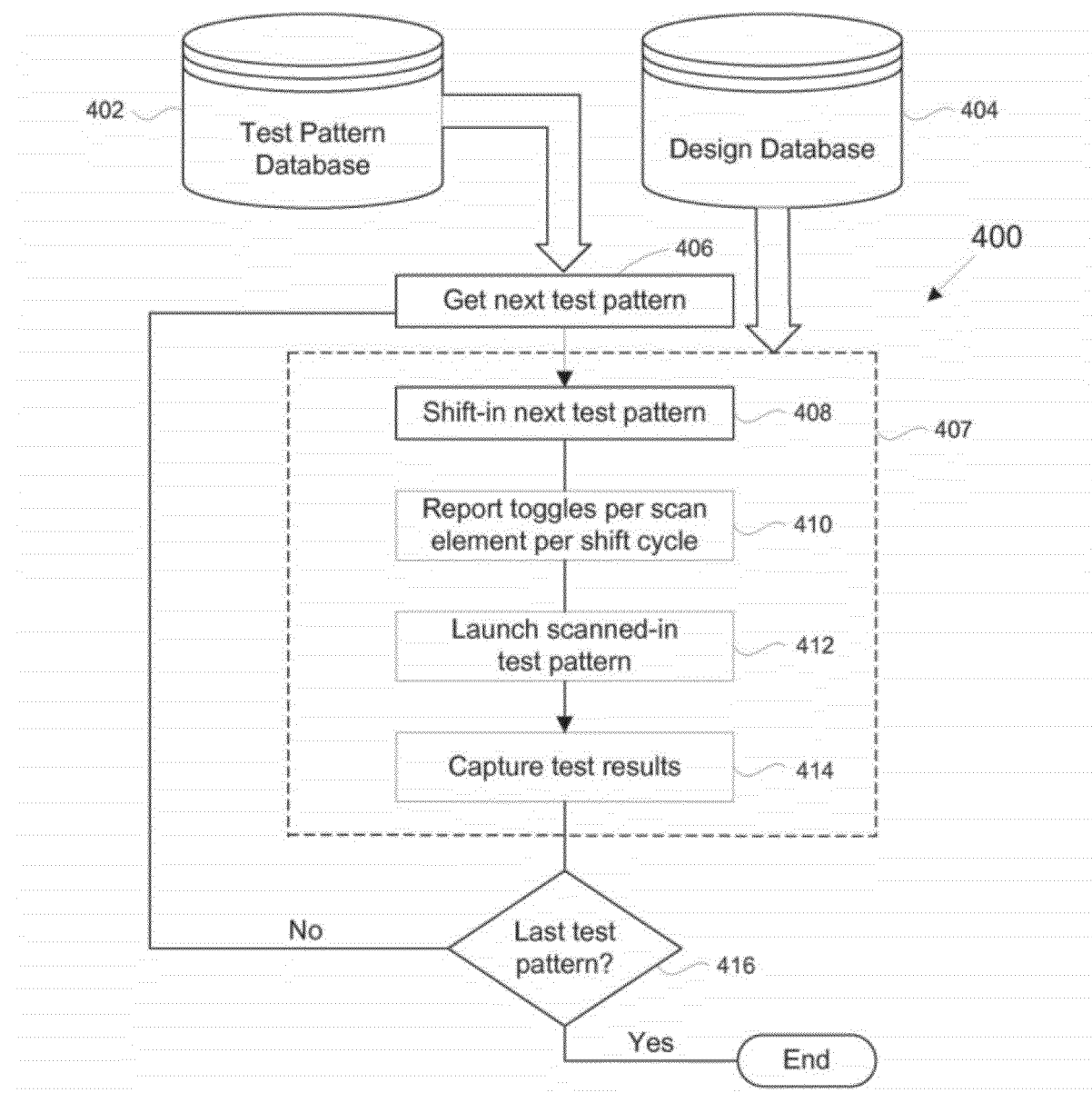
FIG. 5 is an illustrative flow diagram of a computer program controlled process to evaluate whether one or more test patterns is power safe for use during manufacturing testing of an integrated circuit that includes a nonuniform power grid in accordance with some embodiments of the invention.

FIG. 5 is an illustrative flow diagram of a computer program controlled process 500 to evaluate whether one or more test patterns is power safe for use during manufacturing testing of an integrated circuit that includes a nonuniform power grid. The process 500 accesses a test pattern database 502 that comprises a multiplicity of test patterns developed for use in testing an integrated circuit for a variety of potential manufacturing defects. The process 500 tests these test patterns prior to their actual use in manufacturing testing to evaluate whether they are likely to be power-safe. The process 500 also accesses a design database 504 that comprises simulation model information concerning the integrated circuit that is to be tested for manufacturing defects using the ATPG patterns.

Process module 506 obtains from the test pattern database 502 a next test pattern to be tested and provides it to a simulation process module indicated by dashed lines 507, which includes process modules 508-514. The simulation process module 507 uses a simulation model of the integrated circuit from the design database 504 simulate operation of a scan chain into which proposed test patterns are shifted in and from which simulated test results are shifted out. Simulation process module 508 simulates shifting in of the obtained next test pattern bit-by-bit, clock cycle by clock cycle, and simulates the simultaneous shifting out of the prior contents of the scan chain bit-by-bit, clock cycle by clock cycle. Simulation module block 510 reports the number of toggles per scan cycle and also reports which scan elements toggle during each scan cycle. This information can be used to evaluate whether a toggle threshold has been met for a power grid region during an individual scan-in clock cycle, which could indicate that the test pattern is not power safe. This information also can be used to evaluate overall switching activity of individual scan elements or groups of scan elements spaced close together. A relatively high overall switching activity could mean that a test pattern is unsafe. Simulation module 512 simulates launching of the scanned in test pattern from the scan elements to the functional circuitry (e.g. combinational logic) of the integrated circuit to stimulate a circuit response. Simulation module 514 simulates capture of the results produced by the functional logic in response to the stimulation by the scanned in pattern.

Decision process module 516 determines whether the last test pattern has been evaluated. If yes, then the process 500 ends. If no, then the process 500 returns to module 506 and obtains a next test pattern form the test pattern database 502.

FIG. 6 is an illustrative drawing of representing scan-in to an example four scan element long scan chain 600, of a first test pattern followed by the launch of that first scan pattern and the capture of results in the scan chain, followed by scan-in of a second test pattern to the scan chain and the corresponding scan out of the results from the scan chain in accordance with some embodiments of the invention. The upper section of FIG. 6 labeled 'shift n–1' represents a simulation of a four clock cycle shift in of a first proposed test pattern (test pattern n–1) 1010. The prior contents of the scan chain are 0110. At time t0, prior to the start of the scan in of the first proposed test pattern, the contents of the scan chain view $600t0(n-1)$ are 0110. At time t1, the contents of the scan chain view $600t1(n-1)$ are 0011. At time t2, the contents of the scan chain view $600t2(n-1)$ are 1001. Also, at time t2 the remaining portion of the pattern to be scanned in is 10, and the portion of the prior contents already scanned out is 10. Details of the further progress of the remaining shift-in cycles t3 and t4 can be seen by reference to FIG. 6.

Figure 1:
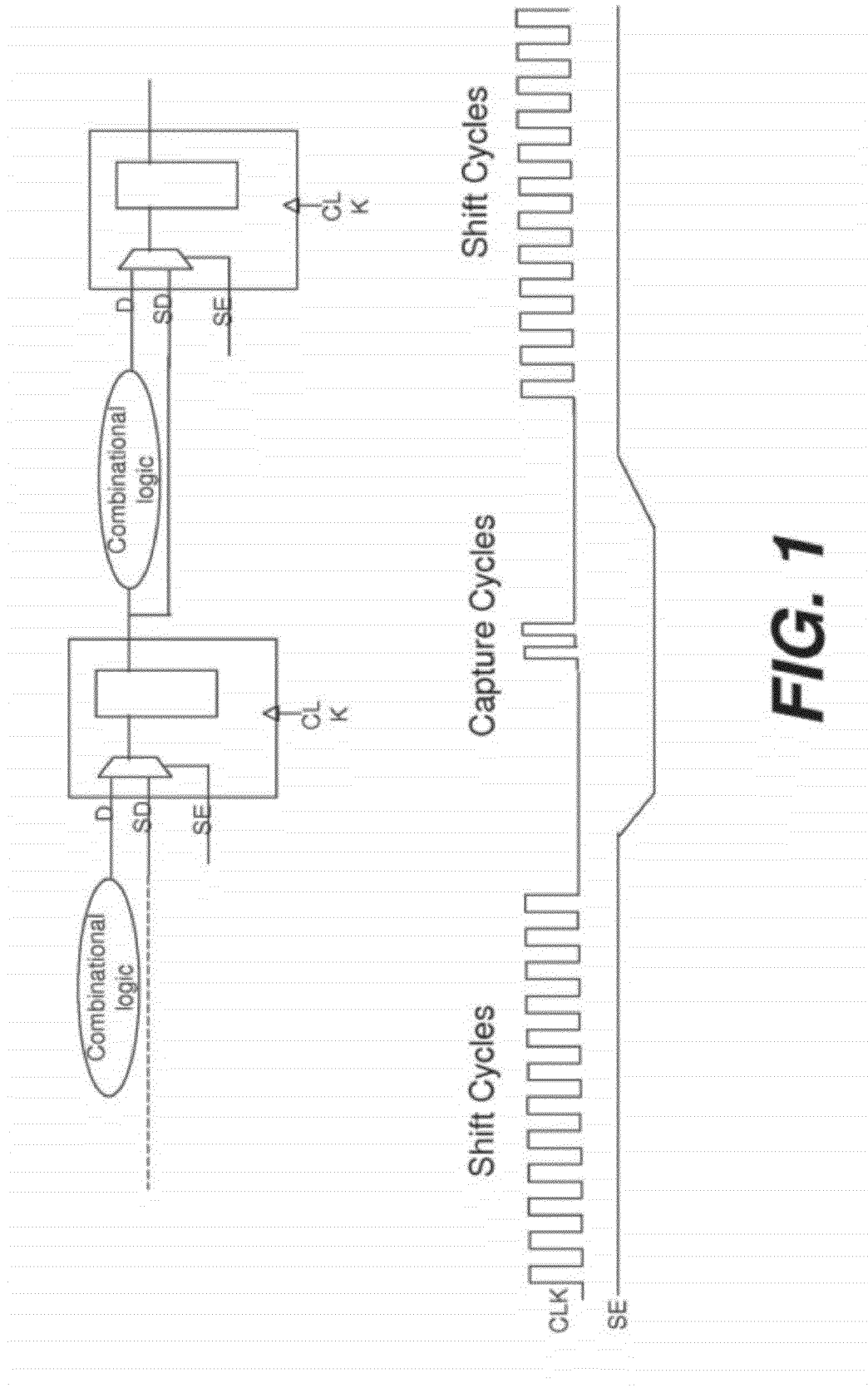
FIG. 1 is an illustrative drawing of a portion of an integrated circuit including two scan cells in a scan chain and generic combinational logic and showing scan shift and capture timing signals used to trigger the scan cells during san shift cycles and capture cycles respectively.

The middle section of FIG. 6 labeled represents the example scan chain view 600R following simulated launch of the first test pattern to functional logic (e.g. combinational logic) (not shown, but see FIG. 1 for example) of the circuit and capture into the scan elements of the scan chain the simulated response of that logic to the stimulus. The captured contents are 1100. These contents serve as the prior content for a second proposed test pattern ('shift n') that is shown in the bottom portion of the drawing.

Therefore, it will be appreciated that the captured contents as shown in scan chain view 600R result from the simulated correct (i.e. without defects) response of the circuit to the launched stimulus pattern. As such, the number and location of toggles experienced during this simulated shift of the next proposed test pattern are likely to be the same as or nearly the same as, actual toggles experienced during manufacturing testing of an actual physical integrated circuit.

The lower section of FIG. 6 labeled 'shift n' represents a simulation of a four clock cycle shift in of a second proposed test pattern (test pattern n) 0110. The prior contents of the scan chain are now the captured contents 1100. At time t0, prior to the start of the scan in of the second proposed test pattern, the contents of the scan chain view $600t0(n)$ are 1100. At time t1, the contents of the scan chain view $600t1(n)$ are 0110. At time t3, the contents of the scan chain view $600t3(n)$ are 1101. Also, at time t3 the remaining portion of the pattern to be scanned in is 0, and the portion of the prior contents already scanned out is 110. Details of the other shift-in cycles can be seen by reference to FIG. 6.

Table 1 shows number of toggles per shift-in cycle involved in shifting the first and second proposed bit patterns

TABLE 1

| Time Cycle | Shift n − 1 | Shift n |
|---|---|---|
| T1 | 2 | 2 |
| T2 | 2 | 3 |
| T3 | 3 | 2 |
| T4 | 3 | 3 |

Another problem confronted during an integrated circuit design process is to find the worst-case clock cycles to perform IR drop analysis also has been an industry wide problem. See for example, C. C. Weng, C. S. Yang, S. Y. Huang, "*Precise identification of the worst-case voltage drop conditions in power grid verification*",—Proceedings of the 2006 IEEE/ACM international conference on Computer-aided Design, pp 112-118. Design testing dynamic IR drop problems typically involves a cycle-by-cycle computer simulation of circuit operation. In some complex designs, several hours may be required for a computer to compute analyze a single cycle during an dynamic IR drop analysis. Therefore, an analysis of all the clock cycles for IR drop problems could prove to be impossible because of the huge computer runtime. As an alternative, in accordance with another aspect of the invention, an analysis of a value change dump (VCD) can be made to determine which cycles involve switching activity levels that are more likely to result in IR drop problems. Only those cycles then will be analyzed in detail for IR drop problems. In general, a VCD may contain the information concerning switching in the combinational logic. However, in some embodiments of the invention a VCD is used that includes only the switching information for the sequential logic so as to narrow down the cycles that may be of concern.

More particularly, a computer software based simulation tool is used to simulate function mode operation of a circuit design during multiple clock cycles. A VCD is produced for each cycle. As explained above, different regions of the circuit design have different power grid densities and perhaps different decoupling capacitance densities. The VCD for each clock cycle is evaluated to determine whether switching activity in one or more regions of the design during the cycle exceeds a selected switching activity threshold for the region. As explained above, different regions may have different switching activity thresholds determined.

Clock cycles are identified in which the level of switching activity exceeds a switching activity threshold for one or more power grid regions. Different power grid regions may have different switching activity thresholds. The identified cycles are subject to detailed IR drop analysis using a tool such as Encounter Voltage Storm for Dynamic IR Drop Analysis, produced by Cadence Design Systems. Inc. having a place of business in San Jose, Calif. Cycles that are not identified as having excessive switching are not subjected to such detailed IR drop analysis. This approach to identifying clock cycles with higher levels of switching activity can reduce the number of clock cycles subjected to detailed IR drop analysis from few 10,000 s to few 10 s, which in turn could reduce entire runtime of a Dynamic IR drop analysis by a factor of perhaps 1,000×, for example.

Figure 7:
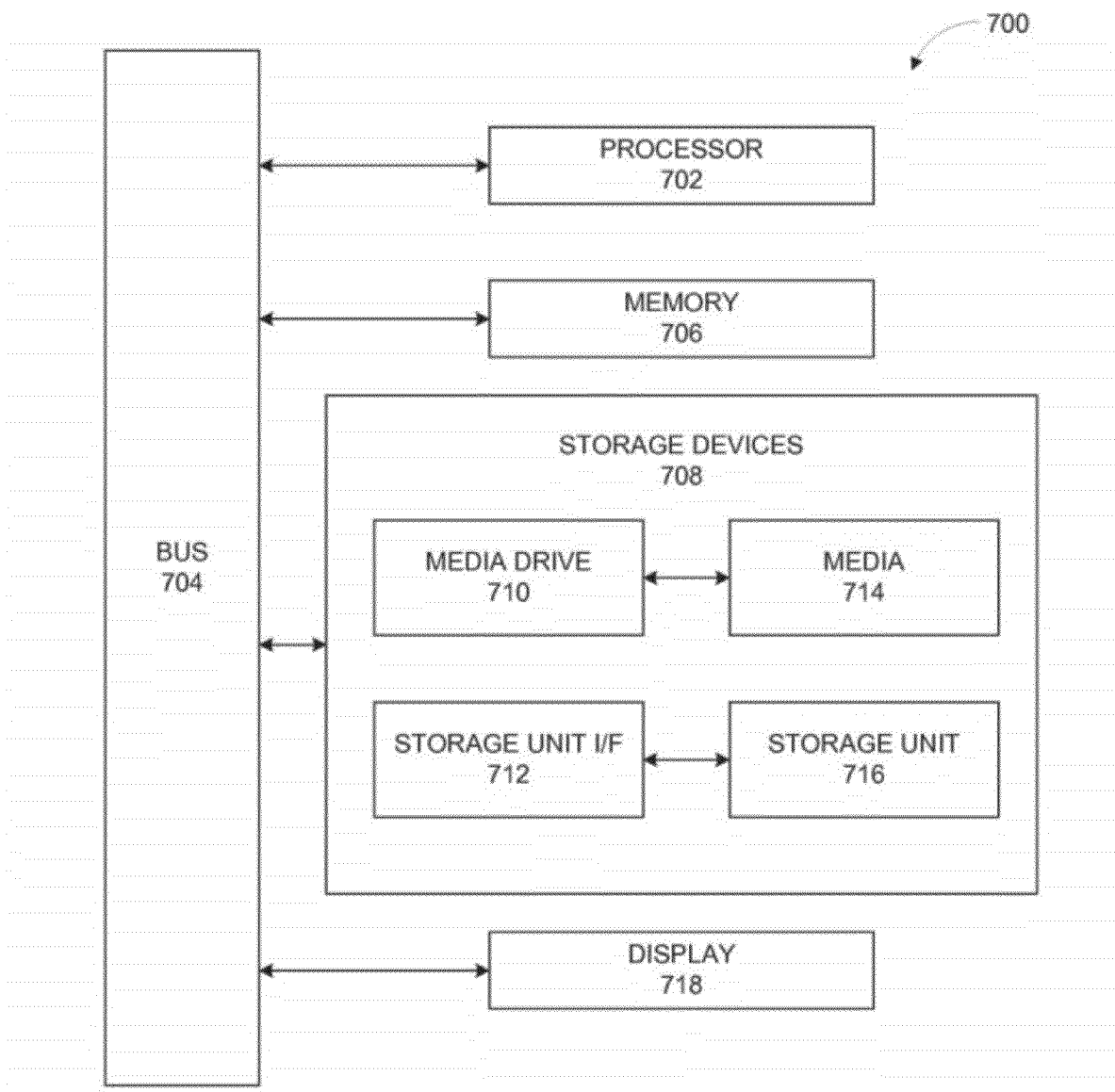
FIG. 7 is an illustrative block level diagram of a computer system 700 that can be programmed to implement processes involved evaluating whether proposed test patterns for use in manufacturing testing of integrated circuits having nonuniform power grids are power safe in accordance with embodiments of the invention.

FIG. 7 is an illustrative block level diagram of a computer system 700 that can be programmed to implement processes involved evaluating whether proposed test patterns for use in manufacturing testing of integrated circuits having nonuniform power grids are power safe in accordance with embodiments of the invention. Computer system 700 can include one or more processors, such as a processor 702. Processor 702 can be implemented using a general or special purpose processing engine such as, for example, a microprocessor controller or other control logic. In the example illustrated in FIG. 7, processor 702 is connected to a bus 704 or other communication medium.

Computing system 700 also can include a main memory 706, preferably random access memory (RAM) or other dynamic memory, for storing information and instructions to be executed by processor 702. Main memory 706 also may be used for storing temporary variables or other intermediate information during execution of instructions to be executed by processor 702. Computer system 700 can likewise include a read only memory ("ROM") or other static storage device coupled to bus 704 for storing static information and instructions for processor 702. The main memory 706 and the storage devices 708 may store data such as an test pattern database or design database or a computer program such as an integrated circuit design simulation process, for example. The main memory 706 and the storage devices 708 may store instructions such as instructions to count toggles per scan element per scan cycle in the course of a scan-in of a proposed test pattern and to evaluate whether a test pattern is power safe. The main memory 706 and the storage devices 708 also may store instructions to simulate launch of a stimulus test pattern from a scan chain and capture by the scan chain of simulated results in response to the stimulus.

The computer system 700 can also includes information storage mechanism 708, which can include, for example, a media drive 710 and a removable storage interface 712. The media drive 710 can include a drive or other mechanism to support fixed or removable storage media 77. For example, a hard disk drive, a floppy disk drive, a magnetic tape drive, an optical disk drive, a CD or DVD drive (R or RW), or other removable or fixed media drive. Storage media 714, can include, for example, a hard disk, a floppy disk, magnetic tape, optical disk, a CD or DVD, or other fixed or removable medium that is read by and written to by media drive 710. Information storage mechanism 708 also may include a removable storage unit 716 in communication with interface 712. Examples of such removable storage unit 716 can include a program cartridge and cartridge interface, a removable memory (for example, a flash memory or other removable memory module). As these examples illustrate, the storage media 714 can include a computer useable storage medium having stored therein particular computer software or data.

The computer system 700 also includes a display unit 718 that can be used to display information such as IR drop maps.

Moreover, the display unit can be used to display toggle information associated with one or more proposed test patterns.

In this document, the terms "computer program medium" and "computer useable medium" are used to generally refer to media such as, for example, memory 706, storage device 708, a hard disk installed in hard disk drive 710. These and other various forms of computer useable media may be involved in carrying one or more sequences of one or more instructions to processor 702 for execution. Such instructions, generally referred to as "computer program code" (which may be grouped in the form of computer programs or other groupings), when executed, enable the computing system 700 to perform features or functions of the present invention as discussed herein.

The foregoing description and drawings of preferred embodiments in accordance with the present invention are merely illustrative of the principles of the invention. Various modifications can be made to the embodiments by those skilled in the art without departing from the spirit and scope of the invention, which is defined in the appended claims.

The foregoing description and drawings of preferred embodiments in accordance with the present invention are merely illustrative of the principles of the invention. Various modifications can be made to the embodiments by those skilled in the art without departing from the spirit and scope of the invention, which is defined in the appended claims.

The invention claimed is:

1. A method to identify clock cycles that involve switching activity levels that are more likely to result in IR drops that utilize detailed IR drop analysis, wherein the design includes a nonuniform power grid that includes a first power grid region having first physical characteristics and having a second power grid region having a second physical characteristics, the method comprising:
    using a computer system to run a simulation model of the integrated circuit to simulate scan mode operation of a circuit design during multiple clock cycles;
    capturing value changes of sequential logic in the course of the multiple cycles;
    obtaining respective value change count thresholds for respective power grid regions of the non-uniform power grid based at least in part upon the physical characteristics of the respective power grid regions; and
    determining clock cycles during scan mode operation during which respective numbers of value changes per clock cycle within one or more respective power grid regions meet respective value change thresholds for the one or more respective regions.

2. The method of claim 1 wherein the physical characteristics include grid density.

3. The method of claim 1 wherein the physical characteristics include decoupling capacitance density.

4. The method of claim 1 wherein determining includes:
    using a simulation model of the integrated circuit to perform a simulation that includes:
    simulating scan-in of the test pattern to a corresponding scan chain within the simulation model, wherein respective scan elements of the corresponding scan chain store prior content values that are scanned out as the test pattern is scanned in.

5. The method of claim 1 wherein determining includes:
    using a simulation model of the integrated circuit to perform a simulation that includes:
    simulating storage of prior content values to a corresponding scan chain within the simulation model;
    simulating scan-in of the test pattern to the corresponding scan chain;
    simulating scan-out of the prior content values from the corresponding scan chain as the test pattern is scanned in to the corresponding scan chain.

6. The method of claim 1 wherein determining includes:
    using a simulation model of the integrated circuit to perform a simulation that includes, loading a test pattern to a corresponding scan chain within the simulation model;
    simulating launch of the test pattern from the scan elements of the corresponding scan chain to combinational logic of the integrated circuit;
    simulating capture to the scan elements of the corresponding scan chain response values produced by the integrated circuit in response to the launch of the prior test pattern;
    simulating scan-in of a next test pattern to the corresponding scan chain;
    wherein respective captured response values are shifted out of the scan chain as the next test pattern is scanned in to the scan chain.

7. The method of claim 6 wherein loading includes simulating scan-in of the test pattern from the scan elements of the corresponding scan chain.

8. The method of claim 1 wherein obtaining includes determining the first threshold value based upon parameter information stored in computer readable storage.

9. The method of claim 1,
    wherein obtaining the first threshold value includes determining the first threshold value based upon parameter information stored in a computer readable storage; and
    wherein obtaining the second threshold value includes determining the second threshold value based upon parameter information stored in computer readable storage.

10. A system to identify clock cycles that involve switching activity levels that are more likely to result in IR drops that utilize detailed IR drop analysis, wherein the design includes a nonuniform power grid that includes a first power grid region having first physical characteristics and having a second power grid region having a second physical characteristics, wherein the system includes a processor, a communication bus and a non-transitory machine readable storage device encoded with program code to configure the processor to perform a process comprising:
    using a simulation model of the integrated circuit to simulate scan mode operation of a circuit design during multiple clock cycles;
    capturing value changes of sequential logic in the course of the multiple cycles;
    obtaining respective value change count thresholds for respective power grid regions of the non-uniform power grid based at least in part upon the physical characteristics of the respective power grid regions; and
    determining clock cycles during which respective numbers of value changes per clock cycle within one or more respective power grid regions meet respective value change thresholds for the one or more respective regions.

11. The system of claim 10 wherein the physical characteristics include grid density.

12. The system of claim 10 wherein the physical characteristics include decoupling capacitance density.

13. An article of manufacture that includes a non-transitory computer readable storage device that stores code to configure a processor to perform a method to identify clock cycles that involve switching activity levels that are more likely to result in IR drops that utilize detailed IR drop analysis, wherein the design includes a nonuniform power grid that includes a first power grid region having first physical characteristics and having a second power grid region having a second physical characteristics, wherein the system includes a processor, a communication bus and a non-transitory machine readable storage device encoded with program code to configure the processor to perform a process comprising:

using a simulation model of the integrated circuit to simulate scan mode operation of a circuit design during multiple clock cycles;

capturing value changes of sequential logic in the course of the multiple cycles;

obtaining respective value change count thresholds for respective power grid regions of the non-uniform power grid based at least in part upon the physical characteristics of the respective power grid regions; and determining clock cycles during scan mode operation during which respective numbers of value changes per clock cycle within one or more respective power grid regions meet respective value change thresholds for the one or more respective regions.

14. The article of claim 13 wherein the physical characteristics include grid density.

15. The article of claim 13 wherein the physical characteristics include decoupling capacitance density.

16. A system to identify clock cycles that involve switching activity levels that are more likely to result in IR drops that utilize detailed IR drop analysis, wherein the design includes a nonuniform power grid that includes a first power grid region having first physical characteristics and having a second power grid region having a second physical characteristics, the system comprising:

means for using a simulation model of the integrated circuit to simulate scan mode operation of a circuit design during multiple clock cycles;

means for capturing value changes of sequential logic in the course of the multiple cycles;

means for obtaining respective value change count thresholds for respective power grid regions of the non-uniform power grid based at least in part upon the physical characteristics of the respective power grid regions; and means for determining clock cycles during scan mode operation during which respective numbers of value changes per clock cycle within one or more respective power grid regions meet respective value change thresholds for the one or more respective regions.

\* \* \* \* \*